(12) United States Patent
Goislard De Monsabert et al.

(10) Patent No.: US 7,993,703 B2
(45) Date of Patent: Aug. 9, 2011

(54) METHOD FOR MAKING NANOSTRUCTURES

(75) Inventors: Thomas Goislard De Monsabert, Saint Ismier (FR); Jean Dijon, Champagnier (FR)

(73) Assignee: Commissariat a l'Energie Atomique, Paris (FR)

( * ) Notice: Subject to any disclaimer, the term of this patent is extended or adjusted under 35 U.S.C. 154(b) by 664 days.

(21) Appl. No.: 11/915,238

(22) PCT Filed: May 29, 2006

(86) PCT No.: PCT/FR2006/050489
§ 371 (c)(1),
(2), (4) Date: Nov. 21, 2007

(87) PCT Pub. No.: WO2007/003826
PCT Pub. Date: Jan. 11, 2007

(65) Prior Publication Data
US 2008/0197766 A1 Aug. 21, 2008

(30) Foreign Application Priority Data
May 30, 2005 (FR) .................... 05 51412

(51) Int. Cl.
C23C 16/00 (2006.01)
C23C 16/26 (2006.01)
(52) U.S. Cl. ............... 427/249.9; 427/249.1; 427/249.2; 427/249.7; 427/249.8; 427/301

(58) Field of Classification Search .......... 313/495–497, 313/306, 309–310, 346, 351, 355; 445/24–25, 445/50–51; 427/301, 249.1, 249.7, 249.8, 427/249.9; 977/712, 720–723, 734, 742, 977/888, 890–891, 895, 935, 939, 952; 423/447.1–447.8
See application file for complete search history.

(56) References Cited

U.S. PATENT DOCUMENTS

| | | | | |
|---|---|---|---|---|
| 6,062,931 A * | 5/2000 | Chuang et al. | ................ | 445/24 |
| 6,541,906 B2 * | 4/2003 | Lee et al. | .................. | 313/495 |
| 6,803,708 B2 * | 10/2004 | Simon et al. | ................ | 313/311 |
| 6,946,787 B2 * | 9/2005 | Oh | ................ | 313/497 |
| 7,094,692 B2 * | 8/2006 | Horibe et al. | ................ | 438/680 |

(Continued)

FOREIGN PATENT DOCUMENTS
EP 1 336 980 8/2003

(Continued)

OTHER PUBLICATIONS

U.S. Appl. No. 11/632,944, filed Jan. 19, 2007, Dijon, et al.

(Continued)

*Primary Examiner* — Nimeshkumar D Patel
*Assistant Examiner* — Jose M Diaz
(74) *Attorney, Agent, or Firm* — Oblon, Spivak, McClelland, Maier & Neustadt, L.L.P.

(57) ABSTRACT

A process for making nanostructures on a support, including: supplying a support including a surface layer on one of its faces, covering the surface layer by a catalyst layer structured according to a pattern exposing areas of the surface layer covered by the catalyst and areas of the surface layer not covered by the catalyst, etching the thickness of the surface layer in the areas not covered by the catalyst layer, and selectively growing nanostructures on the areas of the surface layer covered by the catalyst. The process can also be used to make cathode structures with electrically independent nanostructures.

18 Claims, 12 Drawing Sheets

U.S. PATENT DOCUMENTS

| | | | |
|---|---|---|---|
| 7,175,494 B1* | 2/2007 | Kang et al. | 445/50 |
| 7,446,469 B2* | 11/2008 | Lee | 313/496 |
| 7,521,851 B2* | 4/2009 | Tolt | 313/311 |
| 2002/0060514 A1* | 5/2002 | Nakamoto | 313/311 |
| 2002/0172820 A1* | 11/2002 | Majumdar et al. | 428/357 |
| 2002/0175408 A1* | 11/2002 | Majumdar et al. | 257/734 |
| 2002/0175617 A1* | 11/2002 | Lee et al. | 313/495 |
| 2003/0122467 A1* | 7/2003 | Cho et al. | 313/309 |
| 2003/0230968 A1* | 12/2003 | Lee et al. | 313/495 |
| 2004/0036400 A1* | 2/2004 | Simon et al. | 313/311 |
| 2004/0037972 A1* | 2/2004 | Simon et al. | 427/575 |
| 2004/0161929 A1 | 8/2004 | Son et al. | |
| 2004/0183422 A1* | 9/2004 | Kuroda et al. | 313/310 |
| 2005/0161662 A1* | 7/2005 | Majumdar et al. | 257/18 |
| 2005/0236963 A1* | 10/2005 | Kang et al. | 313/495 |
| 2006/0238096 A1* | 10/2006 | Han et al. | 313/311 |
| 2007/0222357 A1 | 9/2007 | Dijon et al. | |

FOREIGN PATENT DOCUMENTS

| | | |
|---|---|---|
| EP | 1 582 501 | 10/2005 |
| FR | 2 593 953 | 8/1987 |
| FR | 2 798 507 | 3/2001 |
| FR | 2 798 508 | 3/2001 |
| JP | 2004281166 A * | 10/2004 |
| JP | 2004362960 A * | 12/2004 |
| WO | 2004 063091 | 7/2004 |

OTHER PUBLICATIONS

A. P. Graham, et al., "Towards the Integration of Carbon Nanotubes in Microelectronics", Diamond and Related Materials, XP 004507963, vol. 13, No. 4-8, pp. 1296-1300, 2004.

David J. Srolovitz, et al., "The Thermodynamics and Kinetics of Film Agglomeration", Journal of Metals, Vo. 47, No. 3, pp. 31-36, 76-77, 1995.

Jong Hyung Choi, et al., "Control of Carbon Nanotubes Density Through NI Nanoparticle Formation Using Thermal and $NH_3$ Plasma Treatment", Diamond and Related Materials, vol. 12, 794-798, 2003.

Jong Hyung Choi, et al., "Density Control of Carbon Nanotubes Using $NH_3$ Plasma Treatment of NI Catalyst Layer", Thin Solid Film, vol. 435, pp. 318-323, 2003.

Y. Tu, et al., "Growth of Aligned Carbon Nanotubes With Controlled Site Density", Applied Physics Letters, vol. 80, No. 21, pp. 18-20, 2002.

G. S. Duesberg, et al., "Ways Towards the Scaleable Integration of Carbon Nanotubes Into Silicon Based Technology", Diamond and Related Materials, vol. 13, pp. 354-361.

* cited by examiner

METHOD FOR MAKING NANOSTRUCTURES

TECHNICAL DOMAIN

This invention relates to a process for manufacturing nanostructures on a support, particularly electrically independent nanostructures. The invention is particularly applicable to nanotubes emitting electrons in cathode structures for flat screens.

STATE OF PRIOR ART

The nanostructures to which we are referring in this case are auto-assembled structures localized by catalytic growth on a supported catalyst. For example the invention may relate to nanotubes, nanofilaments or nanowires.

The catalytic growth of nanostructures on a supported catalyst makes it necessary to use a material for the catalyst support, that limits diffusion of the catalyst within the support, and particularly at the growth temperature.

Furthermore, if it is required to obtain electrically addressable and electrically independent nanostructures, the catalyst support must be conducting but it must not create an electrical contact between the nanostructures. Therefore, the support must be discontinuous, in other words it must be conducting under the auto-assembled structures and electrically insulating (or missing) between the auto-assembled structures.

One known method for obtaining such a discontinuous support consists of structuring the support using electronic or optical lithography techniques. However, for small and/or high density auto-assembled structures, these techniques may be very expensive and only partially effective.

It is particularly interesting to obtain electrically independent nanostructures on a support in the field of cathode structures used in cathodoluminescence display devices excited by field emission and particularly in field emission flat screens.

Cathodoluminescence display devices excited by field emission comprise a cathode that emits electrons, and an anode facing the cathode covered by a luminescent coat. The anode and the cathode are separated by a space in which the vacuum is created.

The cathodes used are often complex diode or triode type cathode structures. Triode structures have an additional electrode called a gate that facilitates extraction of electrons from the cathode. Several triode structures have already been envisaged in prior art. They can be classified into two main families as a function of the position of the gate with respect to the cathode.

A first family of triode structures contains structures in which the cathode is deposited at the bottom of holes made in an insulating layer and in which the gate is located on the insulating layer. These triode structures are called type I structures. An example of such a triode structure is described in document [1] referenced at the end of this description that divulges a process for manufacturing a cathodoluminescence display device excited by field emission, and is illustrated in FIG. 1. FIG. 1 diagrammatically shows a sectional view of a type I cathode structure according to known art for a cathodoluminescence display device excited by field emission. Only one emission device is shown on this figure. A layer 1 made of an electrically insulating material is drilled with a circular hole 2 and is deposited on a support 10. At the bottom of the hole 2 is deposited a conducting layer 3 forming a cathode (over the entire hole as illustrated in FIG. 1 or locally) and supporting a layer 4 made of an electron emitting material (for example a layer of electron emitting nanostructures such as carbon nanotubes). The upper face of the insulating layer 1 supports a metallic coat 5 forming an electron extraction gate and surrounding the hole 2.

A second family of triode structures contains structures in which the cathode is deposited on an insulating layer and in which the gate is located under the insulating layer. These triode structures are called type II structures. Such triode structures are described in documents [2] and [3]. FIG. 2 diagrammatically shows a sectional view of a type II cathode structure according to known art for a cathodoluminescence display device excited by field emission. Only one emission device is shown on this figure. A layer 11 made of an electrically insulating material deposited on a support 20 supports a gate electrode 15 on its lower face composed of two parts surrounding a cathode 13 arranged on the upper face of the layer 11 and supporting a layer 14 made of an electron emitting material.

It is possible to complexity the stack at the cathode by adding a resistive layer between the cathode conductor and the emissive layer, with the objective of limiting the current emitted by individual emitters so as to make the emission more uniform, and to assure that electronic emission from type I and type II cathode structures takes place correctly (see document [4]). Thus, the resistive layer performs an electron emission regulating role.

One variant embodiment of a type I structure is illustrated in FIG. 3. In this figure, it can be seen that this cathode structure includes a two-part cathode electrode 33 made of a conducting material, a resistive layer 36 covering the two parts of the cathode electrode 33 and the surface of the support 30 located between these two parts, an insulating layer 31 and a metallic layer 35 forming an electron extraction gate, all superposed on a support 30. A hole 32 with width L exposes the resistive layer 36. A layer 34 of emissive material at the center of the hole 32 and at a distance S from the cathode layer 33 formed from a growth area, rests on the resistive layer 36. The distance S is chosen such that the effective length of the resistive layer is of the order of S (and not of the order of the thickness of this layer as in the case in which S=0 (resistive layer on cathode layer)), which can give a higher resistance for exactly the same thickness and resistivity of the resistive layer, and therefore improve the uniformity of the emission. Preferably, the width d of the growth area of the layer 34 of emissive material is small compared with the width L of the hole. This limits the possibilities of contact of the layer of emissive material with the gate electrode, source of a leakage current between the cathode and gate during operation. In this case, the parts of the cathode electrodes 33 are vertically in line with the extraction gate 35. They could also be set back from the line of the gate 35. Details of a process for manufacturing this structure are given in document [4]. The growth area may be discontinuous and structured in pads as shown in FIG. 4 which is a possible top view of the cathode structure in FIG. 3. It shows that the layer 34 of emissive material is distributed on two growth pads separated by a distance U that is of the same order of magnitude as distance S. The distribution of the emissive layer into separate pads assures some electrical independence of emitting areas from each other, and therefore more efficient action of the resistive layer for each pad.

Ideally, the electron emitting nanostructures should be electrically isolated from each other, so that the resistive layer can fully perform its individual role for each nanostructure. However for cost reasons, optical lithography is only used for structures for which the smallest dimension is of the order of 5 μm, while the radius of emitting nanostructures is only a few nm or a few tens of nm.

Thus, in prior art, groups of emitting nanostructures are electrically isolated, rather than each emitting nanostructure. The problem with uniformity of the electrical current is not solved within a single group of emitting nanostructures, because the pad on which they are supported is conducting.

The purpose of the invention is to propose a process for obtaining nanostructures on a support, and particularly electrically connected and independent nanostructures, the said process being effective and less expensive than known processes according to prior art.

More generally, the problem that the invention is designed to solve is to obtain a structured dual layer for the aligned growth of nanostructures without using a lithography mask (deposition and structuring of resin by insolation, etc.), or a mask alignment.

PRESENTATION OF THE INVENTION

This purpose is achieved by a process for making nanostructures on a support characterized in that it includes the following steps:
  supply of a support comprising a surface layer on one of its faces,
  covering of the surface layer by a catalyst layer structured according to a pattern exposing areas of the surface layer covered by the catalyst and areas of the surface layer not covered by the catalyst,
  etching of the thickness of the surface layer in the areas not covered by the catalyst layer,
  selective growth of nanostructures on the areas of the surface layer covered by the catalyst.

Advantageously, the surface layer is a <<barrier layer>> to diffusion of the catalyst to the support.

In our invention, a <<barrier layer>> is a layer made of a material limiting the diffusion of the catalyst material stuck to the barrier layer, particularly at the temperature at which nanostructures are grown on the catalyst.

The nanostructures obtained may be nanotubes, nanofilaments or nanowires.

The catalyst layer is used as an etching mask for the etching step. The etching step of the surface layer in areas not covered by the catalyst consists of a selective and anisotropic etching of the surface layer using the catalyst particles as an etching mask. Etching is continued until the surface layer disappears in areas not covered by the catalyst.

Advantageously, the surface layer is made of a conducting or semi conducting material and the nanostructures are made of a conducting or semi conducting material. The result is thus electrically independent nanostructures.

Advantageously, the support comprises a resistive layer on the face that will support the surface layer. A resistive layer means a layer made of a material with a sufficient resistivity and thickness to limit or regulate the electron flow passing through it. For example, in the case of electron emitting nanostructures, the resistive layer can be used to limit or regulate the current emitted by nanostructures, particularly when the current is high, so as to make the electron emission more uniform.

According to one variant, the support comprises a layer made of a conducting material in contact with the resistive layer. For example, the layer of conducting material may be underneath the resistive layer.

Advantageously, at least part of the thickness of the resistive layer is etched in the areas in which the surface layer is etched.

According to one example, the catalyst layer is structured according to a pattern obtained by fragmentation of a catalyst film on the surface layer. The catalyst film may initially be continuous. The catalyst film may also be initially discontinuous but in this case, the structuring step by fragmentation of the catalyst layer is not compulsory.

Advantageously, the catalyst film on the surface layer is fragmented by increasing the temperature of the catalyst film.

According to one variant, the temperature of the catalyst film is increased globally, for example by annealing.

According to another variant, the increase of the temperature of the catalyst film is located on the surface, for example by laser irradiation or by plasma effect.

Advantageously, the surface layer is made of a material facilitating the fragmentation of the catalyst film.

According to another variant, the catalyst film on the surface layer is fragmented using non-homogenous dry or wet etching techniques of the catalyst film. In other words, only some locations are etched, for example at the grain joints.

According to a first variant, the pattern of the structured catalyst layer is adjusted before performing the etching step of the surface layer. Advantageously, the pattern of the catalyst layer is adjusted by etching the catalyst layer.

According to a second variant, the pattern of the catalyst layer is adjusted by etching of the said catalyst layer after performing the etching step of the surface layer. This provides a means of adjusting the morphology of nanostructures.

According to a third variant, the pattern of the catalyst layer is adjusted initially by etching of the said catalyst layer before performing the etching step of the surface layer, and secondly by etching the said catalyst layer after etching the surface layer.

Advantageously, selective growth of nanostructures on the catalyst is done by chemical vapor phase deposition (CVD), plasma-assisted or not plasma-assisted.

As a variant, the surface layer etching step is carried out after the selective growth of nanostructures.

Advantageously, the surface layer is a barrier layer to diffusion of the catalyst to the support.

The invention also relates to different sorts of cathode structures including electrically independent nanostructures obtained using the previously described manufacturing process.

The invention relates to a cathode structure comprising:
  a conducting layer forming a cathode,
  at least one electron emitting area comprising electron emitting nanostructures formed from a catalyst layer covering a barrier layer to diffusion of the catalyst, the said barrier layer being supported by a resistive layer, the nanostructures being electrically connected to the conducting layer forming the cathode through the barrier layer and the resistive layer,
  a metallic layer forming an extraction gate to extract electrons emitted by the nanostructures, characterized in that the nanostructures are electrically independent nanostructures.

According to a first example, the conducting layer forming the cathode is arranged at the bottom of at least one hole formed in a layer made of an electrically insulating material; the conducting layer forming the cathode supports the resistive layer, itself supporting the electron emitting area comprising nanostructures, and the upper face of the said layer made of an electrically insulating material supports the metallic layer forming the extraction gate.

According to a second example, the conducting layer forming the cathode and the electron emitting area comprising nanostructures are arranged one at the side of the other and separated by the resistive layer; the metallic layer forming the extraction gate is separated from the conducting layer forming the cathode by an electrically insulating layer. They are electrically connected through the resistive layer inserted between the conducting layer forming the cathode and the emitting area.

According to a third example, the lower face of a layer of electrically insulating material supports the metallic layer forming the extraction gate divided into two parts and surrounding the layer of conducting material forming the cathode located on the upper face of the layer of electrically insulating material, the said conducting layer forming the cathode supporting a resistive layer, itself supporting the electron emitting area.

Finally, the invention relates to a device comprising a cathode and an anode, covered by a luminescent layer, the anode being arranged facing the cathode, and the anode and the cathode being separated by a space in which a vacuum is created, characterized in that the cathode comprises electrically independent nanostructures made using the process according to the invention.

The invention also relates to a field emission flat screen, characterized in that it comprises at least one cathode structure according to the invention.

BRIEF DESCRIPTION OF THE FIGURES

The invention will be better understood and other advantages and special features will appear after reading the following description given as a non-limitative example with reference to the appended figures, wherein.

Note that the different elements represented in these figures are not drawn to scale, for simplification reasons.

DETAILED PRESENTATION OF PARTICULAR EMBODIMENTS

We will now describe an example embodiment of electrically independent nanostructures on a support according to the invention, in detail.

A surface layer 101 is deposited on a face of a support 100, for example a glass substrate. Advantageously, this layer is a barrier layer, in other words it is made of a material that limits diffusion of the catalyst to the substrate (particularly at the nanostructure growth temperature). Remember that, since it is required to obtain electrically independent nanostructures with an electrical transport function, the barrier layer must be electrically conducting because nanostructures are electrically addressed through their support, in this case the surface layer. This surface layer can be made of a material chosen from among TiN, TiW, TaN, Cr, Mo . . . .

Furthermore, if it is required that the catalyst layer should be structured by fragmentation by dewetting the catalyst layer, it is preferable that the surface layer should be made of a material facilitating dewetting.

In this example, it is chosen to deposit a surface layer 101 made of TiN with a thickness of the order of 100 nm.

Figure 5:
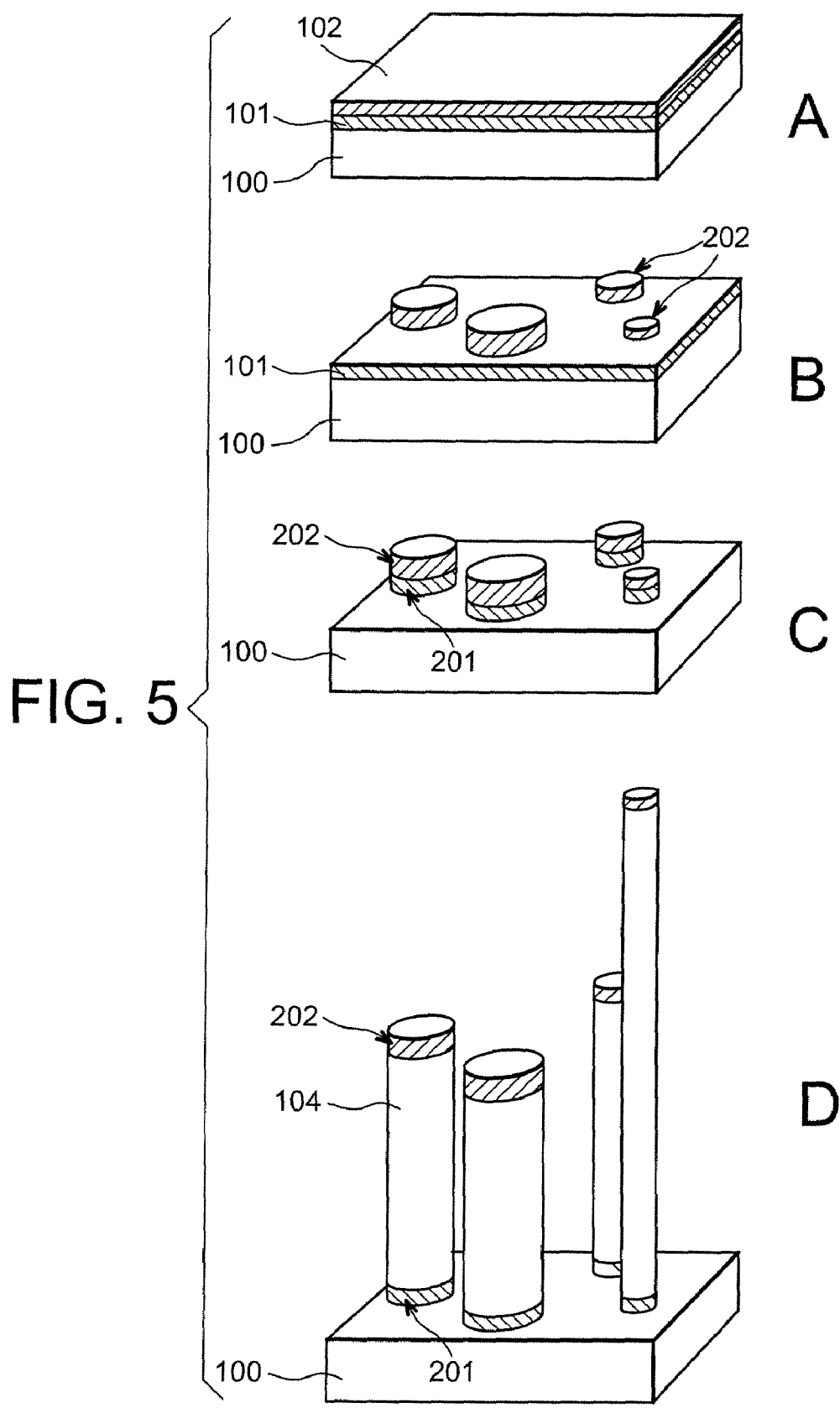

A catalyst layer 102 made of Ni, for example with a thickness of 10 nm, is then deposited above this surface layer 101. If this catalyst layer is to be fragmented by dewetting, the thickness of the catalyst layer must be less than a given threshold, known to those skilled in the art, that depends on the materials used and for example studied in document [5]. Typically, the thickness of Ni must be less than or equal to 10 nm so as to achieve dewetting of Ni on TiN at 600° C. The result is then a stack composed of the support substrate 100 supporting a surface layer 101 and a catalyst layer 102 as illustrated in FIG. 5a. It would also have been possible to choose a surface layer 101 made of TaN and a catalyst layer 102 made of a material chosen from among the group comprising Fe, Co, Ni, Pt or any alloy including one of these materials. Deposits of the layer 101 of TiN and the layer 102 of Ni may for example be obtained by cathodic sputtering and vacuum evaporation respectively.

The catalyst layer 102 is then structured so that it has a pattern including solid areas in which the catalyst is present and areas in which the catalyst has disappeared to expose the subjacent surface layer 101 (FIG. 5b). The solid areas form what is called growth areas in which the nanostructures will grow.

This structure may be achieved by fragmentation of the catalyst layer on the surface layer. Fragmentation may be obtained by increasing the temperature of the stack globally (for example by annealing) or locally on the surface (for example by laser irradiation or by plasma). Note that fragmentation will only take place if the (barrier layer-catalyst) couple is such that the difference between the surface energies of the two materials is sufficient to enable fragmentation by dewetting. For the TiN—Ni couple of materials, annealing at 600° C. under a pressure of 0.2 mbars of hydrogen is suitable for a 10 nm thick layer of Ni.

Fragmentation can also be obtained by non-homogenous dry (for example by plasma) or wet etching techniques of the catalyst layer 102. Thus, etching by DC plasma of $NH_3$ at 390° C. can fragment an Ni film (for example see documents [6] and [7] mentioned at the end of this description).

According to one variant, the catalyst layer 102 may be initially discontinuous or structured. Known techniques for depositing the catalyst layer directly in structured form include electrochemical depositions (see document [8]), or depositions of aggregates or discontinuous growth, Volmer-Weber mode, that corresponds to instantaneous dewetting at ambient temperature for very thin deposited thicknesses. In this case, an additional step can be performed to refine the pattern that will be used for etching the surface layer, for example by etching or annealing. But this additional step may be superfluous if the pattern obtained after deposition is already appropriate.

Once the catalyst layer 102 has been structured according to an appropriate pattern, selective and anisotropic etching of the surface layer 101 is done using the catalyst as an etching mask: the surface layer 101 is etched in areas not covered by the catalyst layer 102. An appropriate pattern means a pattern in which the growth areas of nanostructures are arranged at locations at which it is required that the nanostructures should grow, but in particular have dimensions and a density adapted to the type of nanostructures to be grown. In general, the pattern will represent catalyst islands, in other words ovoid shaped heaps dispatched on the barrier layer at random so as to obtain nanostructures with an elliptical base.

Etching is continued until the surface layer 101 disappears in areas not covered by the catalyst 102. The support substrate then includes catalyst islands 202 on surface layer islands 201 (FIG. 5c).

Anisotropic and selective etching for the TiN—Ni materials couple may be obtained using an RIE plasma of $SF_6$: the surface layer 101 of TiN is etched directionally (anisotropic etching) and neither the catalyst islands 202 of Ni (selective etching), nor the surface layer islands 201 (surface layer of TiN covered by catalyst Ni) are etched.

According to one variant, the density and size distribution of catalyst islands 202 obtained after the structuring step can be adjusted, by dry or wet etching of part of the catalyst. Catalyst islands with a determined diameter and density can thus be obtained. This adjustment by etching may be done between the structuring and etching steps of the surface layer 101, and/or between the etching step of the surface layer 101 and the selective growth step of the nanostructures. The latter case results in smaller catalyst pads than the surface layer pads on which they are supported, which in some cases can give a more stable nanostructure.

For example, if it is decided to do wet etching of the catalyst, the sample can be immersed in an etching solution of the catalyst during a determined time. In this case, it is preferred to use a solution that etches the catalyst selectively and does not prevent the catalyst from reacting with precursors (gaseous precursors in the case of growth by CVD) of nanostructures for which it will subsequently catalyze the growth. For example, a solution made by mixing a volume of nitric acid, a volume of acetic acid and four volumes of water can be used to perform etching of the catalyst for 45 seconds.

If it is decided to use dry etching of the catalyst, etching can be done by plasma (RIE, ICP, etc.) or by selective ionic bombardment of the catalyst.

The density and size distribution of catalyst islands 202 may be adjusted by controlling the initial thickness of the catalyst layer 102 in the case in which the catalyst pattern is obtained by dewetting to cause fragmentation of an initially continuous catalyst layer.

Finally, catalytic growth of the nanostructures 104 is made from catalyst islands 202. This growth may be of the <<base growth>> or <<root growth>> type, in which the nanostructures are obtained by catalytic growth with the catalyst anchored on the support, or of the <<tip growth>> type in which the nanostructures 104 are obtained by catalytic growth with the catalyst 202 at the tip of the nanostructures (FIG. 5d).

Carbon nanotubes 104 can be obtained from islands of nickel catalyst 202 by catalytic growth by chemical vapor phase deposition (CVD) of carbon, by increasing the temperature up to 600° C. under 0.2 mbars of hydrogen, and then exposing the sample to a pressure of 0.2 mbars of acetylene, still at 600° C., for 1 minute. The result obtained is thus carbon nanotubes 104 on each surface layer island 201 of TiN, with a catalyst island 202 of Ni at their tip (<<tip growth>> type). The nanotubes can be up to several micrometers long and the radius can be approximately equal to the radius of the catalyst island. CVD growth has the specific feature that it results in a population of nanotubes for which the (length/radius) aspect ratio is highly dispersed as shown in FIG. 5d, in which nanotubes 104 with a variable height and diameter can be seen.

According to one variant, the etching step of the surface layer 101 may take place after the growth step of the nanostructures 104, provided that etching is selective with respect to nanostructures and that the shape of the nanotubes makes it possible (in particular it is preferable that the nanostructures are in line perpendicular to the support).

The invention presents a process for obtaining nanostructures and particularly electrically independent nanostructures. <<Nanostructure>> means any structure auto-assembled and located by catalytic growth on a supported catalyst, that has one nanometric dimension, in other words between 0.5 and 100 nm. <<Electrically independent nanostructures>> means nanostructures for which the electrical potential is different for each nanostructure. On the other hand, nanostructures are not electrically independent when their electrical potential is the same, which for example is the case when they are supported on a conducting support and are electrically connected to each other through this support. Remember also that nanostructures may for example be nanotubes or nanofilaments or nanowires, in general one per nanostructure. But there may also be several nanotubes or nanofilaments or nanowires for each nanostructure, if these elements grow from the same catalyst island and/or on the same surface layer island.

We have just described details of one example formation of nanostructures from a stack composed simply of a support, a barrier layer and a catalyst layer. Other example embodiments are possible, particularly using a much more complex stack. For example, the same steps as above can be carried out by inserting a resistive layer, or a conducting layer above which there is a resistive layer, between the support substrate and the barrier layer. It is also possible to use a multi-layer instead of the catalyst layer, for example a dual layer composed of Fe and Mo, to encourage growth of the nanostructures.

According to one particular embodiment, a stack is made comprising a glass support substrate, a conducting layer 403 made of Mo forming a cathode and a resistive layer 406 made of Si to act as a resistive layer (or ballast), a barrier layer 401 and a catalyst layer 402. The same steps as in FIGS. 5a to 5d described above are then repeated, in other words the step for structuring the catalyst 402, the step for etching the barrier layer 401 and the step for making nanostructures 404 grow on the catalyst islands. All variants described above may also be applicable, particularly the possibility of adjusting the density and size distribution of the catalyst islands obtained after the structuring step, by means of dry or wet etching between the structuring and etching steps of the barrier layer, and/or between the step for etching the barrier layer and the step for selective growth of nanostructures.

Figure 6:
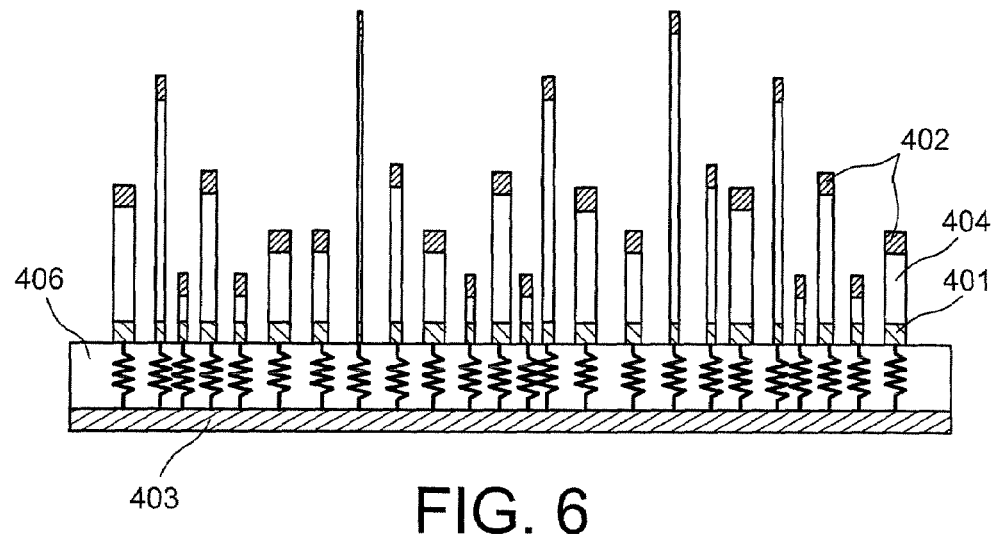
FIG. 6 is a diagrammatic cross-sectional view of an example embodiment according to the invention in which nanostructures are electrically independent.
Figure 7:
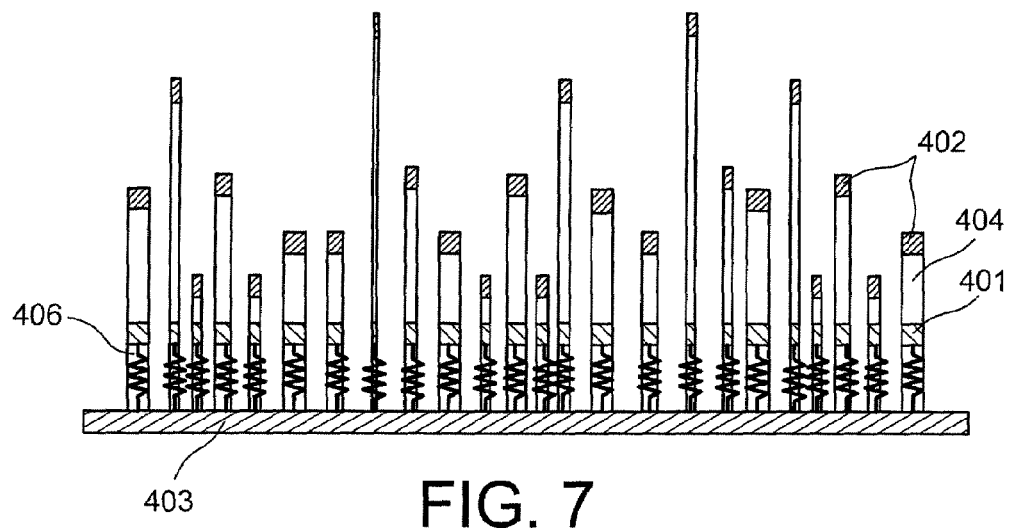
FIG. 7 is a diagrammatic cross-sectional view of another example embodiment according to the invention in which nanostructures are electrically independent.
Figure 8:
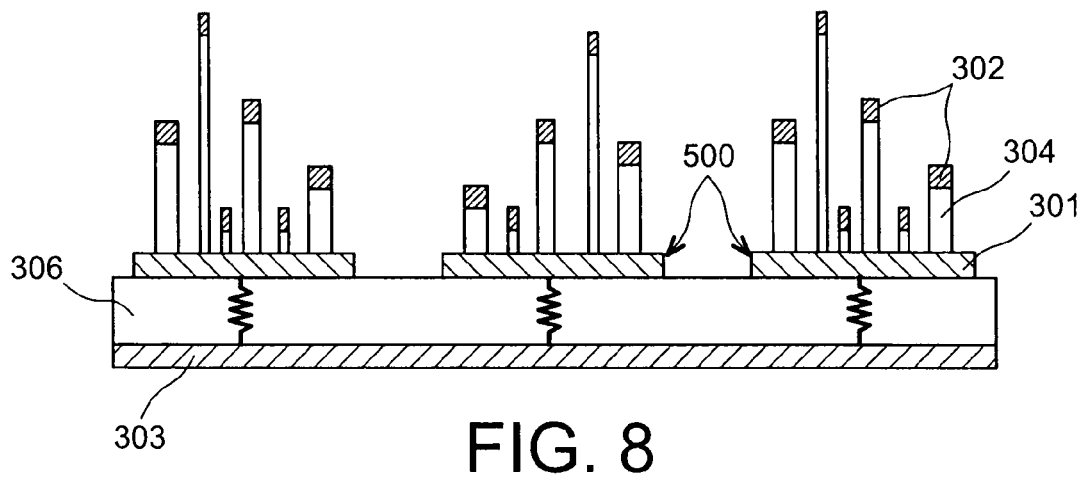
FIG. 8 is a diagrammatic cross-sectional view of nanostructures on barrier layer pads according to prior art.

FIG. 6 shows the case in which etching of the barrier layer 401 was stopped at the resistive layer 406. But stopping etching on the resistive layer is not critical in this special case. Since the resistive layer 406 is on a cathode layer 403, it is possible to etch all or part of this resistive layer, which further facilitates electrical independence of the nanostructures. FIG. 7 illustrates the case in which the entire thickness of the resistive layer 406 and the thickness of the barrier layer 401 have been etched in areas not covered by the catalyst. This etching of the resistive layer may be done at the same time as etching of the barrier layer if the etching technique used for the barrier layer is suitable for the resistive layer, or just after with another etching technique or after growth of nanostructures if possible depending on the nanostructures (as explained above). The final result in the examples illustrated in FIGS. 6 and 7 is electrically independent nanotubes, unlike in prior art as illustrated in FIG. 8 in which only groups of nanotubes 304 may be electrically independent. The nanotubes 304 made by catalytic growth from the catalyst 302 are arranged on blocks 500 made in a barrier layer 301 deposited on a resistive layer 306 supported by a conducting layer 303. Each block 500 is isolated from the other blocks, but each block supports several nanostructures 304. Thus, the electrical potential at the base of each nanostructure in the same block is the same. The invention thus assures electrical independence of nanostructures from each other and an individual action of the resistive layer (illustrated by the zigzag symbol symbolizing a resistance in FIGS. 6 and 7) for each nanostructure, which makes the emission of electrons more uniform.

This particular stack of a support substrate, a conducting layer forming a cathode, a resistive layer forming a ballast, a barrier layer and a catalyst layer is used to make a cathode structure for a field emission flat screen. We will present several example cathode structures with electrically independent nanostructures that can be used in a field emission flat screen.

Figure 9A:
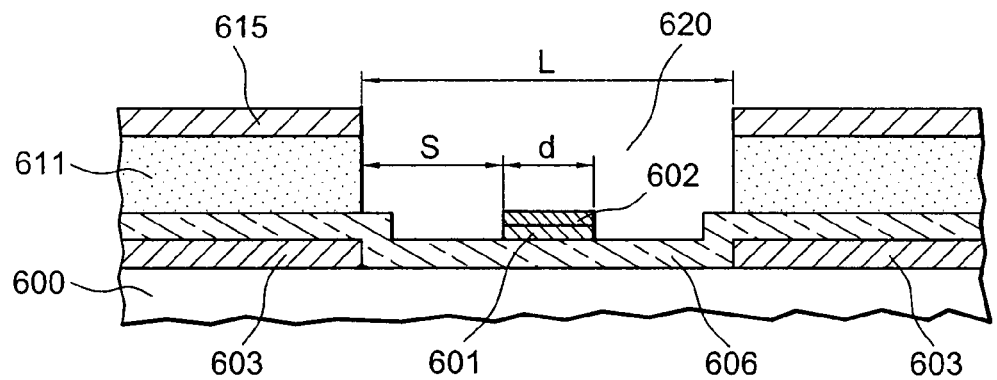
FIGS. 9a and 9b illustrate steps in manufacturing of electrically independent nanostructures in a cathode structure according to the invention.
Figure 9B:
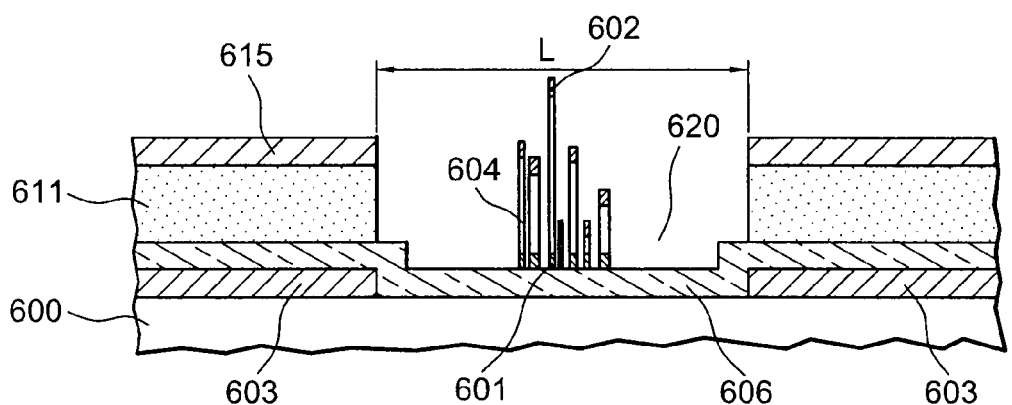

A first example of a cathode structure according to the invention is illustrated in FIG. 9b. This is a type I triode structure shown in a cross-sectional view. FIG. 9a shows that this cathode structure comprises a support 600 above which there is a cathode electrode 603 in two parts made of a conducting material, a resistive layer 606 covering the two parts of the cathode electrode 603 and the support surface 600 located between these two parts, an insulating layer 611 and a metallic layer 615 forming an electron extraction gate. A hole 620 with width L exposes the resistive layer 606. A stack with a width d composed of a barrier layer 601 and a catalyst layer 602 is supported on the resistive layer 606, at the center of the hole 620 and at a distance S from the cathode layer 603. The distance S is chosen to such that the effective length of the resistive layer is of the order of S (and not of the order of the thickness of this layer as in the case in which S=0 (resistive layer on cathode layer)), which can give a higher resistance for the same thickness and resistivity of the resistive layer, and therefore make the emission more uniform. Preferably, the width d of the stack composed of the barrier layer 601 and the catalyst layer 602 is small compared with the width L of the hole. This can limit possibilities of contact of nanostructures with the gate electrode, source of a leakage current between the cathode and the gate in operation. In this case, the parts of the cathode electrode 603 are vertically in line with the extraction gate 605. They could also be set back from the vertical line through the gate 605. Document [4] contains details of a process for making this structure.

The next step is structuring of the catalyst layer 602, etching of the barrier layer 601 and growth of nanostructures 604 according to the manufacturing process described above. The result is then electrically independent nanostructures 604 comprising a base made of a barrier layer 601 and a tip made of a catalyst 602 according to a <<tip growth>> type catalyst growth (see FIG. 9b). In this particular example, the nanostructures 604 are electrically connected to the parts of the cathode electrode 603 through the resistive layer 606. Note that a single emission device is shown in this figure, but the cathode structure may comprise several others.

Figure 10:
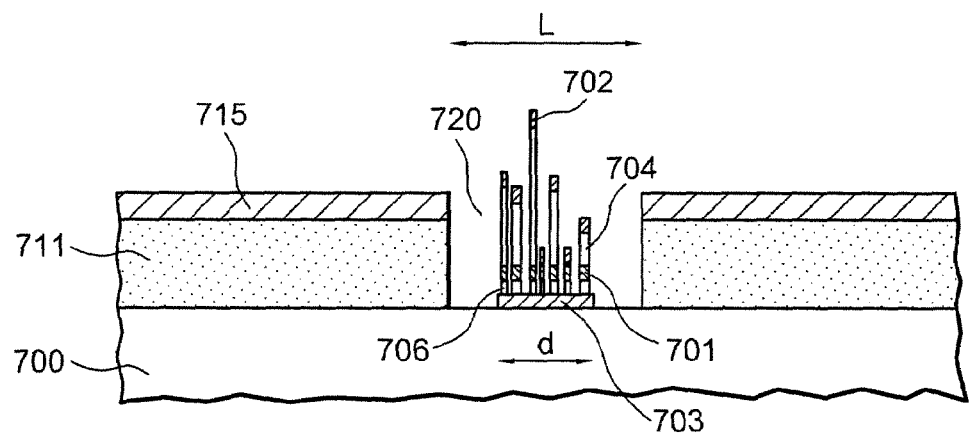
FIG. 10 is a cross-sectional view of a cathode structure according to the invention.

A second example of a type I cathode structure is illustrated in FIG. 10. A support 700 supports a layer 711 made of an electrically insulating material. The layer 711 is drilled with a hole 720 and the upper face of the insulating layer 711 supports a metallic layer 715 forming an extraction gate surrounding the hole 720. There is a stack with width d at the bottom of the hole 720 with width L, composed of a conducting layer 703 forming a cathode supporting electrically independent nanostructures 704. In the same way as in the previous example, the width d of the stack is preferably small compared with the length L of the hole.

These nanostructures 704 were obtained by performing steps in the process according to the invention starting from an initial stack composed of a resistive layer 706, a barrier layer 701 and a catalyst layer 702. This example shows that the entire thickness of the resistive layer 706 has been etched as explained in FIG. 7.

Figure 11:
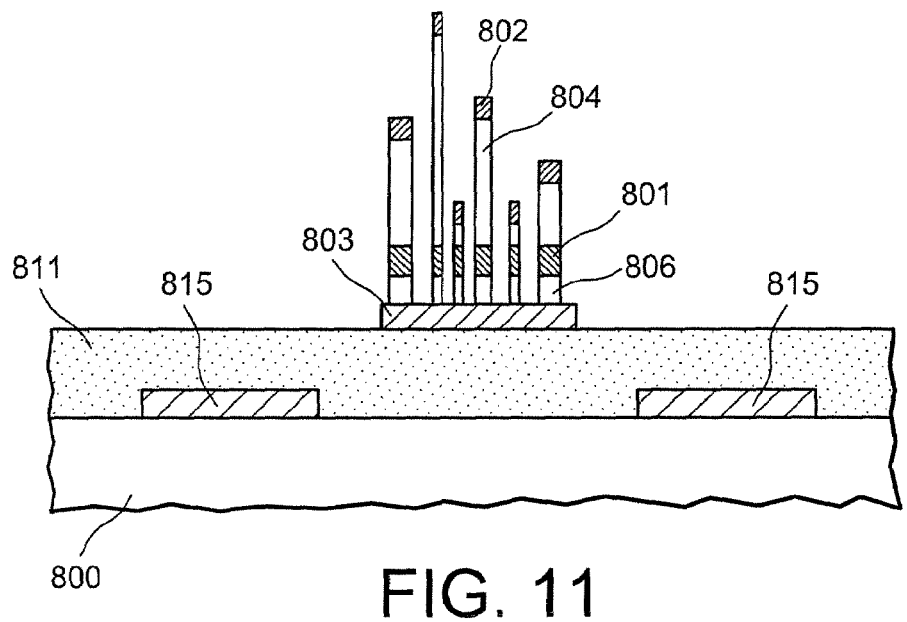
FIG. 11 is a cross-sectional view of another cathode structure according to the invention.

Finally, FIG. 11 shows a sectional view and a diagrammatic view of a type II cathode structure according to the invention. A layer 811 made of an electrically insulating material supports a gate electrode 815 on its lower face, composed of two parts surrounding a cathode 803 placed on the upper face of the layer 811 and supporting electrically independent nanostructures 804. These nanostructures 804 were obtained by performing steps in the process according to the invention from an initial stack composed of a resistive layer 806, a barrier layer 801 and a catalyst layer 802. In this example, the entire thickness of the resistive layer 806 has been etched as explained in FIG. 7.

Note that some constraints may appear for the etching step of the barrier layer in specific cases for manufacturing of the cathode structure.

A first manufacturing constraint to be taken into account appears when the gate conductor of cathode structures is not protected, as is the case in FIGS. 9a and 9b, and 10 (gate conductor 615 or 715). A material has to be chosen for the gate electrode that is not sensitive to etching chosen for the barrier layer. For example, if an $SF_6$ RIE plasma is used to etch the barrier layer, a copper or aluminium gate electrode will not be attacked by the plasma.

Another constraint is to not etch the resistive layer over its entire thickness when the cathode is laid out laterally to the nanostructures, as is the case in FIG. 9b. If the entire thickness of the resistive layer 606 is etched, then the nanostructures would be electrically isolated from the cathode. Remember that in this case the resistive layer 606 electrically connects the nanostructures 604 to parts of the cathode electrode 603. On the contrary, when the cathode is vertically in line with the electron emission nanostructures (for example see FIG. 10 or FIG. 11), the entire thickness of the resistive layer can be etched (provided only that etching spares the electrodes located underneath, such as the cathode and possibly the buried gate). Such etching can have the advantage that it improves insulation between the cathode and the gate conductor. For example, copper or aluminium electrodes could be chosen for $SF_6$ RIE etching.

Each of the cathode structures described above can be used to make a field emission flat screen. This is done by placing the cathode structure facing an anode covered by a luminescent layer, and a vacuum is created in the space separating the anode and the cathode structure.

In general, field emission flat screens are preferably manufactured using carbon nanostructures (nanotubes or nanofilaments) as electron emitters. Carbon nanostructures have several advantages.

Firstly, carbon nanostructures have a high aspect ratio (length/radius) so that the electric field can be amplified by the tip effect at the tip of the nanostructures. Thus, electrons can be extracted by field effect for relatively low applied electric fields.

Furthermore, the electrical and thermal conductivity of carbon nanostructures is compatible with use as an electrode and their chemical inertia guarantees good stability of their properties in the long-term.

Finally, carbon nanostructures may be synthesized locally in situ, on large areas and at relatively low cost.

On the other hand, carbon nanostructures have the disadvantage that they have a wide distribution of aspect ratios, which results in a large distribution of electric field at their tip for a given applied electric field. The electric current extracted by field emission depends exponentially on the electric field at the tip of the emitters. Therefore it is important to minimize this distribution if it is required to obtain a uniform electric current output from each emitter and to obtain a uniform brightness on the screen, which results in an improved visual quality for the screen.

One low cost solution in prior art consisted of placing a resistive layer underneath the barrier layer and grouping the nanotubes on pads of barrier layers electrically isolated from each other. (see FIG. 8). However, this did not solve the problem within a group of nanotubes on the same pad. This invention solves this limitation because the nanostructures obtained are individually clamped by the resistive layer: the electrical potential at the base of each electron emitting nanostructure is different for each, and proportional to the current that passes through it (see FIGS. 6 and 7). Therefore, the invention can be used to increase the number of emitting nanostructures capable of operating under the same applied field conditions. Ideally, all emitting nanostructures can operate together (compared with $1/10^4$ according to the current state of the art).

Figure 1:
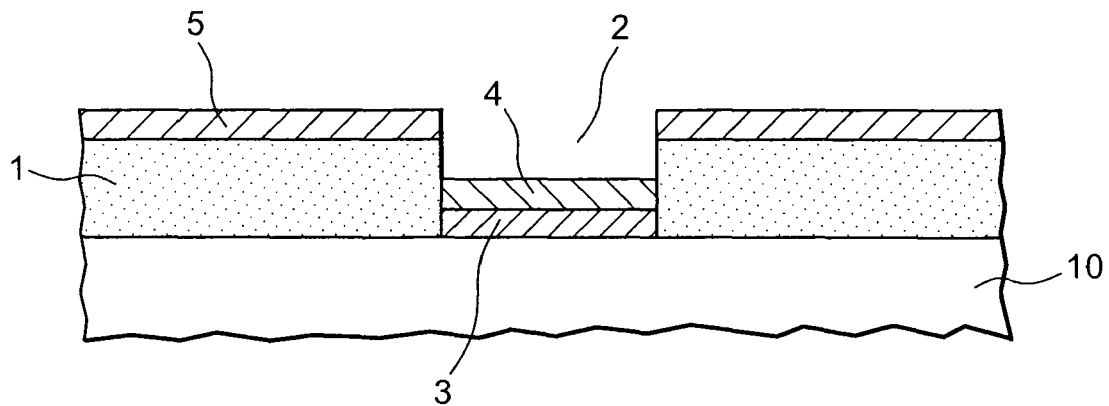
FIG. 1, already described, is a cross-sectional view of a cathode structure with emissive layer, of type I triode according to prior art, FIG. 2, already described, is a cross-sectional view of a cathode structure with emissive layer, of type II triode according to prior art.
Figure 2:
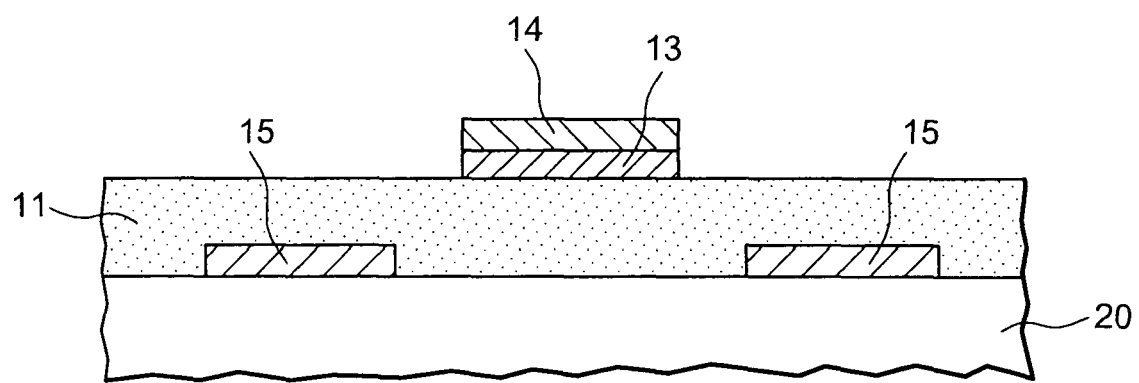
Figure 3:
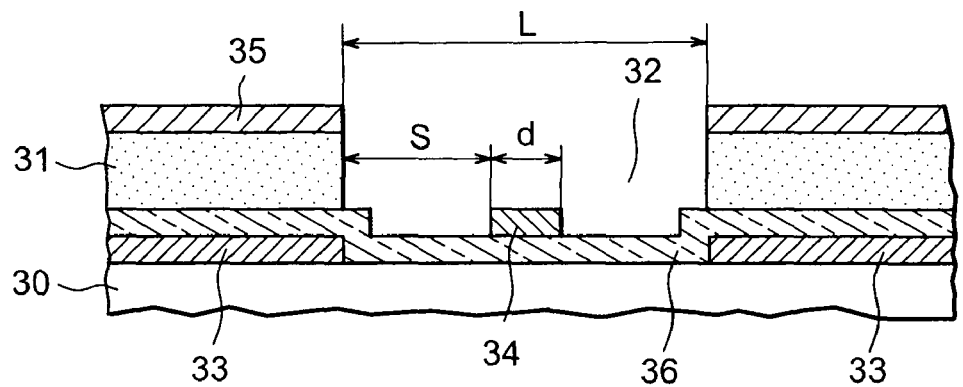
FIG. 3 is a cross-sectional view of another example of a type I cathode structure with emissive layer, according to prior art.
Figure 4:
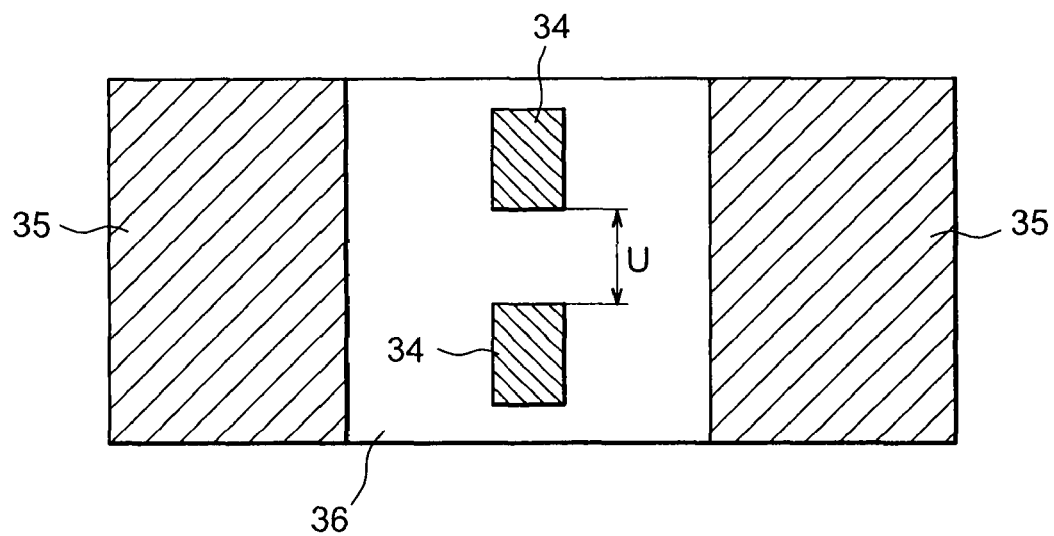
FIG. 4 is a top view of the type I cathode structure with emissive layer as shown in FIG. 3, FIGS. 5a to 5d illustrate steps in the process for manufacturing nanostructures according to this invention.
Figure 12:
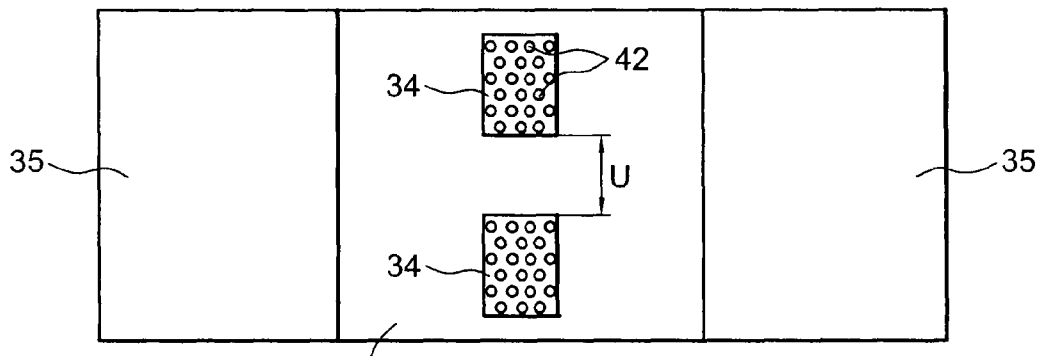
FIG. 12 is a top view of a type I cathode structure with emissive layer according to prior art.
Figure 13:
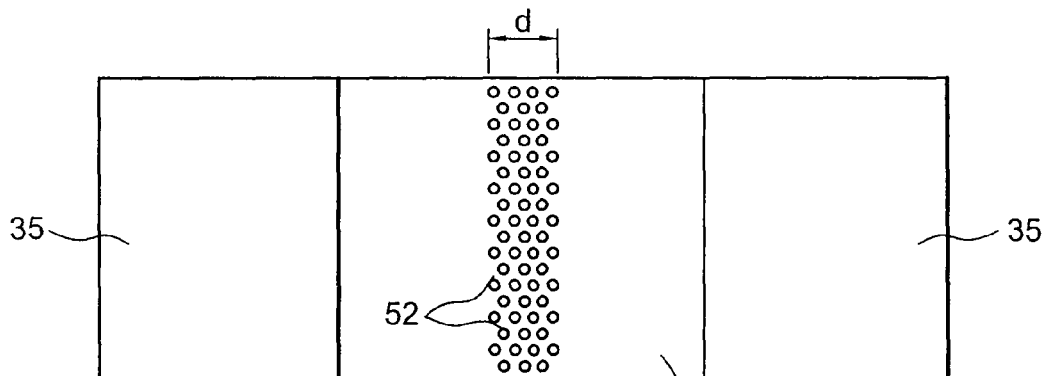
FIG. 13 is a top view of a type I cathode structure with emissive layer according to the invention.

Note that with the process according to the invention, there is no longer any need to structure the barrier layer in the form of pads isolated from each other as described in document [4] and illustrated in FIG. 4 described above. A continuous strip of barrier layer can be deposited because the barrier layer is then etched in areas not covered by the catalyst. Unlike in prior art in which nanostructures 42 located on the same pad 34 are electrically dependent (see FIG. 12), the nanostructures 52 according to our invention may be continuously distributed along a strip with width d and still be electrically independent (see FIG. 13). Thus, the emissive surface of the final device are better than in prior art, while the nanostructures are electrically independent, thus improving the homogeneity of emission from them.

Thus, a new process can be envisaged for making a type I triode structure. FIGS. 14A to 14K illustrate the steps in this process that uses vacuum deposition and photolithography techniques.

Figure 14A:
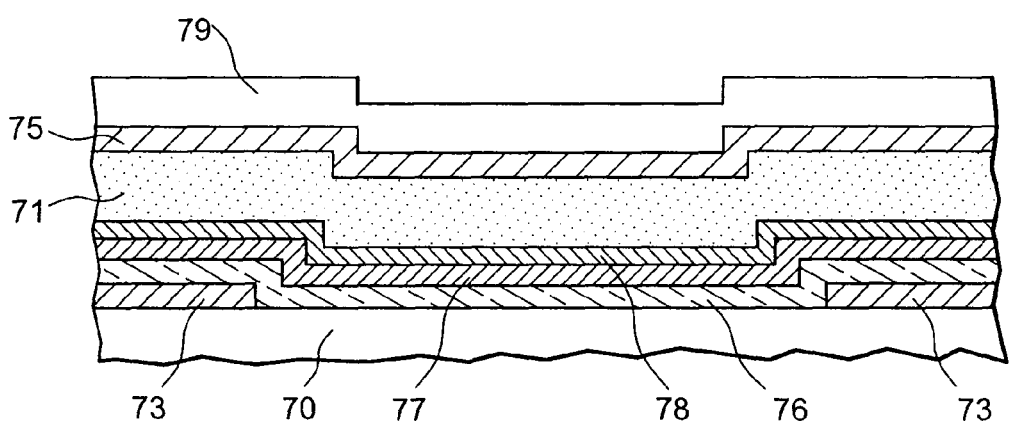
FIGS. 14A to 14K illustrate a process for manufacturing a triode type cathode structure according to the invention.

Firstly, as shown in FIG. 14A, a stack is superposed on a support 70 comprising a cathode electrode 73 in two parts, a resistive layer 76 covering the two parts of the cathode electrode 73, a barrier layer 77, a catalyst layer 78, an insulation layer 71, a metallic layer 75 that will form an electron extraction gate, and a layer of photoresist 79.

The cathode electrode 73 is obtained by deposition of a conducting material, for example molybdenum, niobium, copper or ITO on a support 70, for example made of glass. The deposition of conducting material is then etched in strips, typically 10 μm wide and with a pitch equal to 25 μm. A cathode electrode 73 is formed by associating two strips.

The other layers are obtained by vacuum deposits in the following order: a 1.5 μm thick resistive layer 76 made of amorphous silicon, a barrier layer 77 made of TiN about 100 nm thick and a catalyst layer 78 made of Ni about 10 nm thick, followed by a 1 μm thick insulating layer 71 made of silica or silicon nitride, a metallic layer 75 made of aluminium that will form the electron extraction gate, and finally a layer of photoresist 79.

Figure 14B:
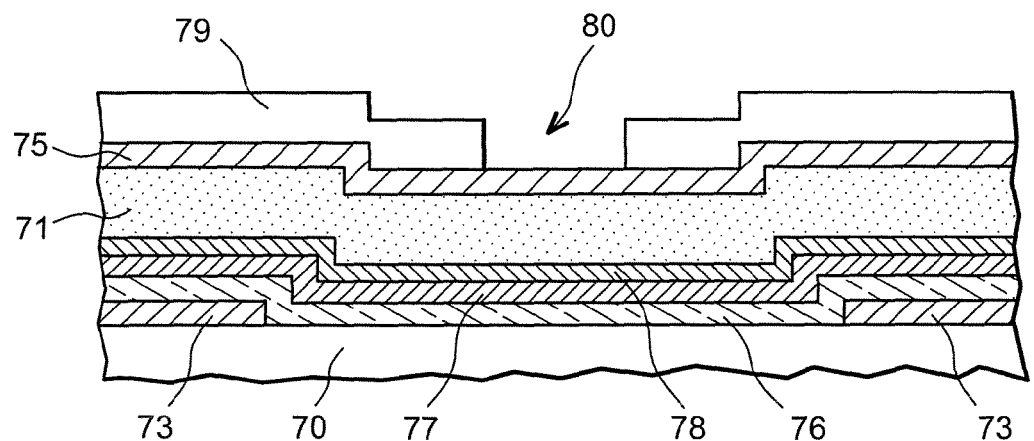

The next step is photolithography of the photoresist layer (see FIG. 14B). The thickness of the photoresist is etched to obtain a port 80 about 6 μm wide and to expose the subjacent gate metallic layer 75.

Figure 14C:
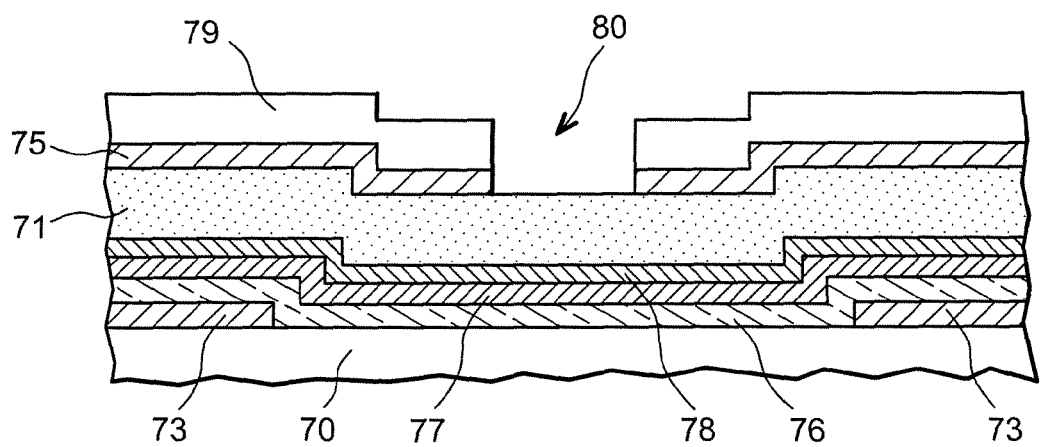
Figure 14D:
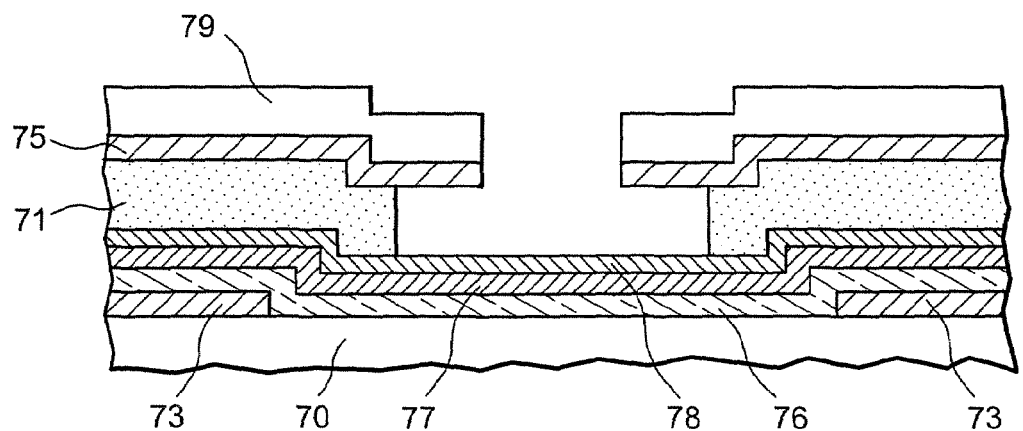
Figure 14E:
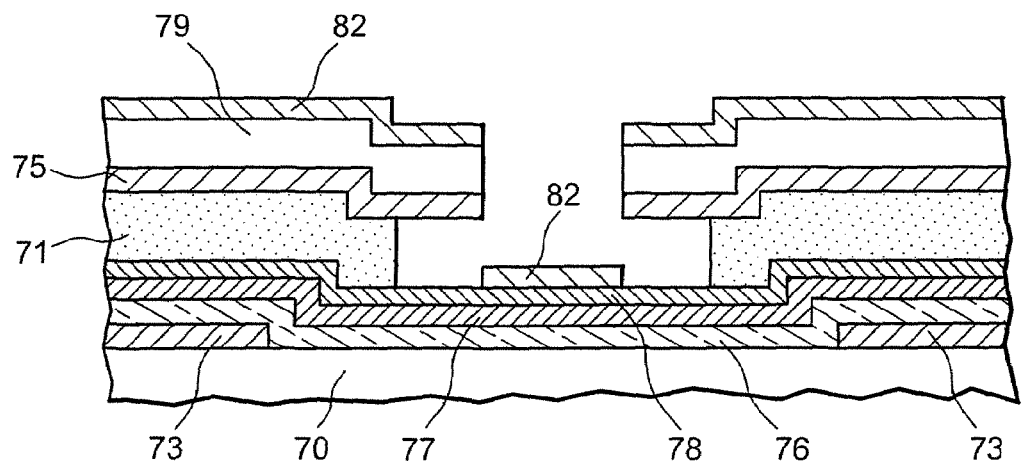

The next step is chemical etching of the gate layer 75 made of aluminium with a mix comprising acetic acid, nitric acid and orthophosphoric acid, using the photoresist 79 as the etching mask (see FIG. 14C).

The next step is to open grooves in the thickness of the silica layer 71 by adding HF through the port formed in the gate layer (FIG. 14D) during the previous step. This wet etching by HF leads to etching <<under>> the gate layer thus creating an overhang at the gate.

The next step is to deposit a protective layer 82 made of chromium at the bottom of the port, and on the layer of photoresist (FIG. 14E) by evaporation.

Figure 14F:
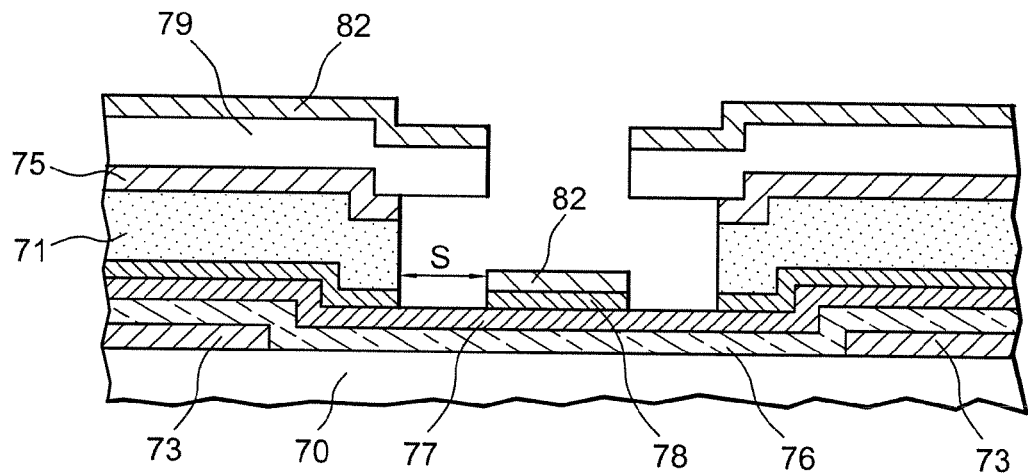
Figure 14G:
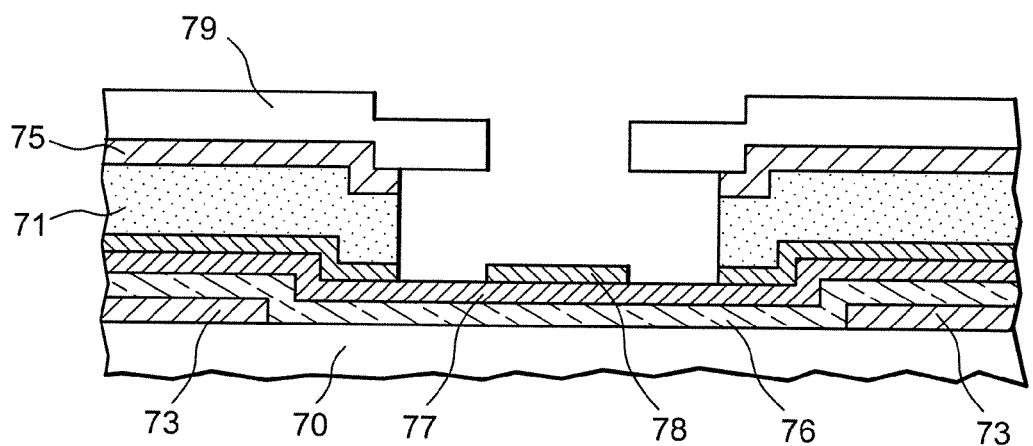

According to FIG. 14F, the catalyst layer not protected by the chromium layer 82 is etched, for example using orthophosphoric acid. The aluminium gate layer not covered by the silica layer (overhanging part) is also etched at the same time so as to form the space S (described above) between the gate and the future electron emitting area and thus prevent short circuits.

Figure 14H:
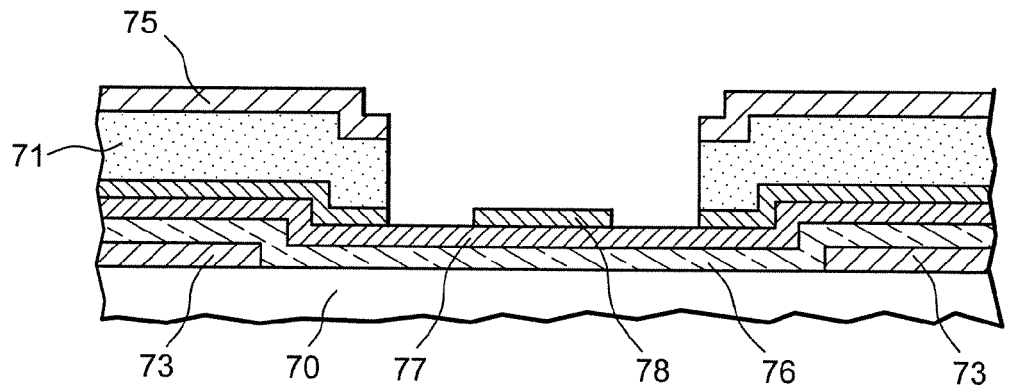
Figure 14I:
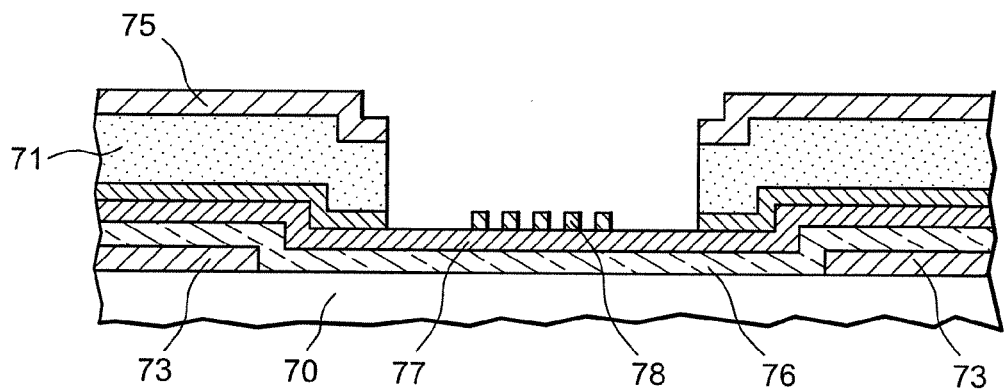

The next step is to eliminate the protective layer by etching it using a commercial mix of perchloric acid and ammonium cerium nitrate (FIG. 14G), and the photoresist is eliminated using the <<lift off>> technique (FIG. 14H).

Figure 14J:
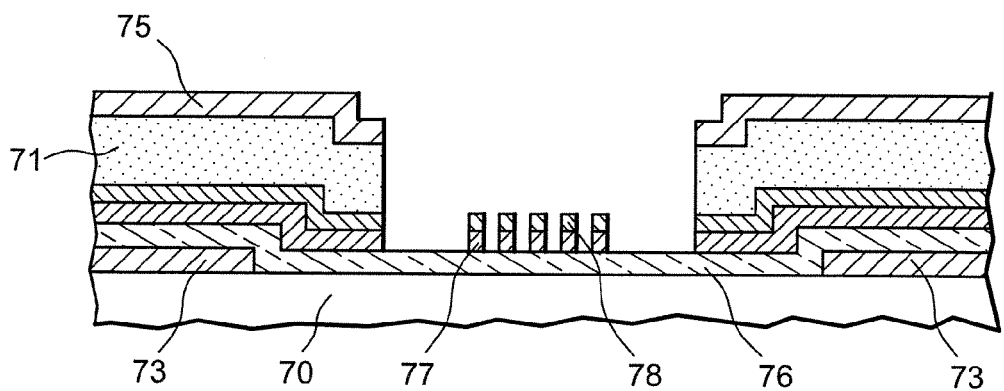

The catalyst layer is fragmented until catalyst islands are obtained (FIG. 14I) and the barrier layer not protected by the catalyst is etched, for example by $SF_6$ RIE plasma (FIG. 14J).

Figure 14K:
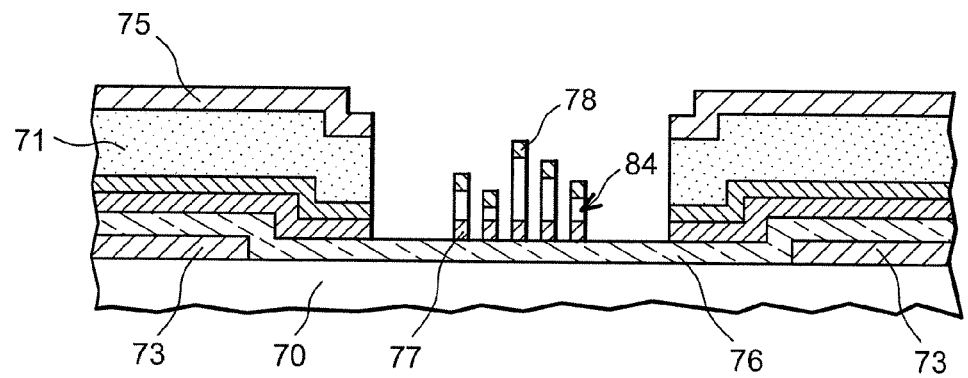

Finally, nanostructures 84 are made to grow on the catalyst islands (FIG. 14K).

The advantage of this process is that it minimizes the number of alignments of etched masks: only one mask is used to etch the cathode electrode and one mask to etch the photoresist.

The need to obtain electrically independent nanostructures may arise in any field in which nanotubes perform an electric function and are supported on a conducting layer. For example, electrically independent nanostructures may be used as a conducting or semi conducting channel between two electrodes. For example, a carbon nanotube may be used as a conducting channel and may connect two different metallization layers in a chip. This carbon nanotube should be able to resist a current density 1000 times greater than a copper conducting channel, that is subject to breakdowns induced by electromigration (see document [9]).

Nanotubes acting as a semi conducting channel can also be made to obtain a vertical coaxially gated CNT transistor (see documents [9] and [10]).

Figures 15A, 15B:
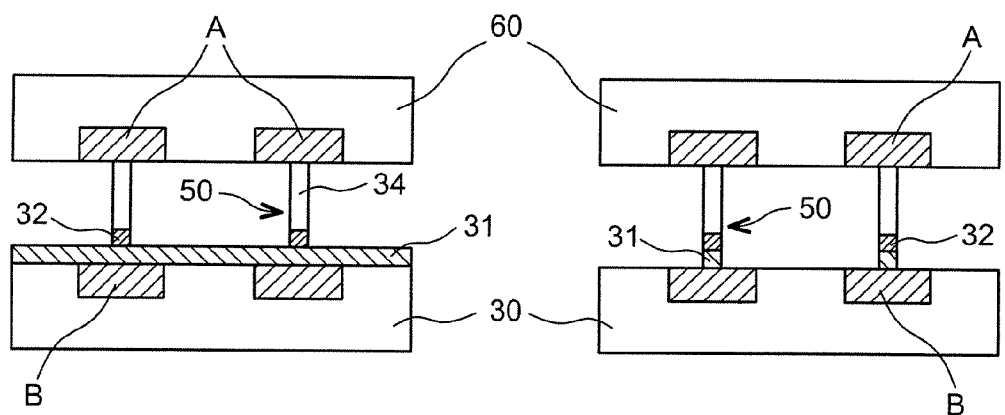
FIGS. 15a and 15b represent nanotubes acting as a conducting or semi conducting channel between two electrodes according to prior art and according to the invention, respectively.

In prior art, the carbon nanotube conducting channel 50 used to connect electrodes B of a first support 30 (for example a chip) and a second overhanging support 60 is usually made by depositing a solid conducting barrier layer 31 on the first support 30 comprising the electrodes B, then by depositing a catalyst pad 32 on each area overhanging the electrodes B, and by CVD growth of carbon nanotubes 34 to connect the electrodes A of the upper support 60 (see FIG. 15a). Due to this invention, each conducting channel 50 is electrically independent of its neighbors because the barrier layer 31 at the bottom of each nanotube 34 is etched using the catalyst 32 as the etching mask (FIG. 15b).

In summary, the process according to the invention has the advantage that it is easy to implement, it is inexpensive, self-aligned (in other words there is no need to align an etching mask) and is compatible with a wide range of dimensions of catalyst particles. The minimum size of catalyst islands that can be used according to the invention is fixed by the degree of anisotropy of etching, its degree of selectivity, and by the thickness of the surface layer to be etched.

BIBLIOGRAPHY

[1] FR-A-2 593 953 (corresponding to U.S. Pat. No. 4,857, 161).
[2] FR-A-2 798 507.
[3] FR-A-2 798 508 (corresponding to U.S. Pat. No. 6,815, 902).
[4] EP 1 336 980 A1 (corresponding to US patent 2003/0184357 A1).
[5] << The Thermodynamics and Kinetics of Film Agglomeration>>, David J. Srolovitz and Max G. Goldiner, Journal of Metals (1995), 47(3), 31-36,76-77.
[6] <<Control of carbon nanotubes density through Ni nanoparticle formation using thermal and $NH_3$ plasma treatment>>, Jong Hyung Choi et al., Diamond and related materials (2003), 12, 794-798.
[7] <<Density control of carbon nanotubes using $NH_3$ plasma treatment of Ni catalyst layer>>, Jong Hyung Choi et al., Thin Solid Films (2003), 435, 318-323.
[8] <<Growth of aligned carbon nanotubes with controlled site density>>, Y. Tu et al., Applied Physics Letters (2002), 80(21), 4018-4020.
[9] G. S. Duesberg et al./Diamond and Related Materials 13 (2004) 354-361.
[10] A. P. Graham et al./Diamond and Related Materials 13 (2004) 1296-1300.

The invention claimed is:

1. A process for making nanostructures on a support, comprising:
supplying the support including a surface layer on one of its faces;
covering the surface layer by a catalyst layer structured according to a pattern exposing areas of the surface layer covered by the catalyst layer and areas of the surface layer not covered by the catalyst layer;
etching a thickness of the surface layer in the areas not covered by the catalyst layer using the catalyst layer pattern as an etching mask; and
selectively growing nanostructures on the areas of the surface layer covered by the catalyst layer.

2. A process for making nanostructures according to claim 1, wherein the surface layer is a barrier layer.

3. A process for making nanostructures according to claim 1, wherein the surface layer is made of a conducting or semi conducting material and the nanostructures are made of a conducting or semi conducting material.

4. A process for making nanostructures according to claim 1, wherein the support includes a resistive layer on a face that will support the surface layer.

5. A process for making nanostructures according to claim 4, wherein the support includes a layer made of a conducting material in contact with the resistive layer.

6. A process for making nanostructures according to claim 4, wherein at least part of a thickness of the resistive layer is etched in areas in which the surface layer is etched.

7. A process for making nanostructures according to claim 4, wherein the catalyst layer is structured according to a pattern obtained by fragmentation of a catalyst film on the surface layer.

8. A process for making nanostructures according to claim 7, wherein the catalyst film on the surface layer is fragmented by increasing a temperature of the catalyst film.

9. A process for making nanostructures according to claim 8, wherein the temperature of the catalyst film is increased globally.

10. A process for making nanostructures according to claim 8, wherein the increase of the temperature of the catalyst film is local on the surface layer.

11. A process for making nanostructures according to claim 7, wherein the surface layer is made of a material facilitating fragmentation of the catalyst film.

12. A process for making nanostructures according to claim 7, wherein the catalyst film on the surface layer is fragmented using non-homogenous dry or wet etching techniques of the catalyst film.

13. A process for making nanostructures according to claim 1, wherein the pattern of the catalyst layer is adjusted before performing the etching of the surface layer.

14. A process for making nanostructures according to claim 13, wherein the pattern of the catalyst layer is adjusted by etching the catalyst layer.

15. A process for making nanostructures according to claim 1, wherein the pattern of the catalyst layer is adjusted by etching the catalyst layer after performing the etching of the surface layer.

16. A process for making nanostructures according to claim 1, wherein the selectively growing the nanostructures on the catalyst layer is executed by chemical vapor phase deposition (CVD).

17. A process for making nanostructures according to claim 1, wherein the etching of the thickness of the surface layer is carried out after the selectively growing the nanostructures.

18. A process for making nanostructures according to claim 17, wherein the surface layer is a barrier layer to diffusion of the catalyst layer towards the support.

* * * * *